(12) United States Patent
Yeh

(10) Patent No.: US 8,738,847 B2
(45) Date of Patent: May 27, 2014

(54) DATA WRITING METHOD, AND MEMORY CONTROLLER AND MEMORY STORAGE APPARATUS USING THE SAME

(75) Inventor: Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 237 days.

(21) Appl. No.: 13/323,812

(22) Filed: Dec. 12, 2011

(65) Prior Publication Data

US 2013/0067141 A1 Mar. 14, 2013

(30) Foreign Application Priority Data

Sep. 14, 2011 (TW) .............................. 100133031 A

(51) Int. Cl.
*G06F 12/16* (2006.01)
(52) U.S. Cl.
USPC .......................................... 711/103; 711/162
(58) Field of Classification Search
None
See application file for complete search history.

(56) References Cited

U.S. PATENT DOCUMENTS

| 2009/0070529 A1* | 3/2009 | Mee et al. ...................... 711/114 |
| 2009/0172256 A1* | 7/2009 | Chu et al. ...................... 711/103 |
| 2010/0318839 A1* | 12/2010 | Avila et al. ........................ 714/5 |
| 2011/0041039 A1* | 2/2011 | Harari et al. .................. 714/773 |
| 2011/0055625 A1* | 3/2011 | Honda ......................... 714/6.11 |

* cited by examiner

*Primary Examiner* — Gary Portka
(74) *Attorney, Agent, or Firm* — Jianq Chyun IP Office

(57) ABSTRACT

A data writing method for a rewritable non-volatile memory module is provided. The rewritable non-volatile memory module has a plurality of lower physical pages and a plurality of upper physical pages respectively corresponding to the lower physical pages. The method includes determining whether a physical page is one of the upper physical pages before writing first data into the physical page; determining whether a backup area stores second data written into one of the lower physical pages corresponding to the physical page if the physical page is the upper physical page; reading the second data from the lower physical page corresponding to the physical page and backing up the second data into the backup area before writing the first data into the physical page when the backup area does not store the second data. Accordingly, the method may effectively prevent data loss due to a program failure.

18 Claims, 13 Drawing Sheets

| Address of lower physical page | Address of upper physical page | |
|---|---|---|
| 0 | 4 | 900(0) |
| 1 | 5 | 900(1) |
| 2 | 8 | 900(2) |
| 3 | 9 | 900(3) |
| 6 | 12 | 900(4) |
| 7 | 13 | 900(5) |
| 10 | 16 | 900(6) |
| 11 | 17 | 900(7) |
| ⋮ | ⋮ | ⋮ |
| 110 | 116 | 900(56) |
| 111 | 117 | 900(57) |
| 114 | 120 | 900(58) |
| 115 | 121 | 900(59) |
| 118 | 124 | 900(60) |
| 119 | 125 | 900(61) |
| 122 | 126 | 900(62) |
| 123 | 127 | 900(63) |

DATA WRITING METHOD, AND MEMORY CONTROLLER AND MEMORY STORAGE APPARATUS USING THE SAME

CROSS-REFERENCE TO RELATED APPLICATION

This application claims the priority benefit of Taiwan application serial no. 100133031, filed on Sep. 14, 2011. The entirety of the above-mentioned patent application is hereby incorporated by reference herein and made a part of this specification.

BACKGROUND OF THE INVENTION

1. Technology Field

The present invention relates to a data writing method. More particularly, the present invention relates to a data writing method for a rewritable non-volatile memory module, and a memory controller and a memory storage apparatus using the same.

2. Description of Related Art

Digital cameras, mobile phones, and MP3 music players have undergone rapid growth in recent years, so that consumer demand for storage media has also drastically increased. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A conspicuous solid state drive (SSD) is a storage apparatus which utilizes a flash memory as its storage medium. Therefore, the flash memory industry has become a very popular part of the electronic industry in recent years.

With the development of semiconductor manufacturing technology, a multi level cell (MLC) NAND flash memory module has been extensively applied. Due to the physical properties of the MLC NAND flash memory, when some physical pages are programmed, charges are rather unstable, and other physical pages adjacent to the programmed physical pages may be affected. For instance, in a 4-level flash memory module, each physical block has a plurality of physical pages, and the physical pages may be categorized into a plurality of lower physical pages and a plurality of upper physical pages respectively corresponding to the lower physical pages, wherein each of the upper physical pages corresponds to one of the lower physical pages. Namely, memory cells on the same word line constitute a physical page pair that contains one lower physical page and one upper physical page. The speed of writing data into the lower physical page is faster than the speed of writing data into the upper physical page; therefore, the lower physical page is defined as a fast physical page, while the upper physical page is defined as a slow physical page. Particularly, while the upper physical page is being programmed, given that there is a program failure, the data stored in the lower physical page corresponding to the programmed upper physical page may be lost.

Hence, compared to a single level cell (SLC) NAND flash memory module, the MLC NAND flash memory module has relatively large capacity, whereas the reliability of the MLC NAND flash memory module is worse. Therefore, a data writing method that can increase the reliability of the MLC NAND flash memory module need be developed.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

The present invention is directed to a data writing method and a memory controller capable of effectively improving the reliability of writing data into a rewritable non-volatile memory module.

The present invention is further directed to a memory storage apparatus capable of reliably storing data.

According to an exemplary embodiment of the present invention, a data writing method for a rewritable non-volatile memory module is provided, wherein the rewritable non-volatile memory module has a plurality of physical blocks, each of the physical blocks has a plurality of physical pages, the physical pages are grouped into a plurality of physical page pairs, each of the physical page pairs at least includes a lower physical page and an upper physical page, and the speed of writing data into the lower physical page is faster than the speed of writing the data into the upper physical page. The data writing method includes receiving a write command and first data corresponding to the write command and writing the first data into a first physical page of the physical pages, wherein the first physical page belongs to a first physical page pair among the physical page pairs. The data writing method also includes determining whether the first physical page is the upper physical page of the first physical page pair before writing the first data into the first physical page. The data writing method still includes determining whether a backup area stores second data before writing the first data into the first physical page when the first physical page is the upper physical page of the first physical page pair, wherein the second data is already written into the lower physical page of the first physical page pair. The data writing method further includes, when the backup area does not store the second data, reading the second data from the lower physical page of the first physical page pair and temporarily storing the second data into the backup area before writing the first data into the first physical page.

According to another exemplary embodiment of the present invention, a memory controller for operating a rewritable non-volatile memory module is provided, wherein the rewritable non-volatile memory module has a plurality of physical blocks, each of the physical blocks has a plurality of physical pages, the physical pages are grouped into a plurality of physical page pairs, each of the physical page pairs at least includes a lower physical page and an upper physical page, and the speed of writing data into the lower physical page is faster than the speed of writing the data into the upper physical page. The memory controller includes a host interface, a memory interface, and a memory management circuit, wherein the host interface is configured for coupling to a host system, the memory interface is configured for coupling to the rewritable non-volatile memory module, and the memory management circuit is coupled to the host interface and the memory interface. The memory management circuit is configured for receiving a write command and first data corresponding to the write command, and writing the first data into a first physical page among the physical pages, wherein the first physical page belongs to a first physical page pair of the physical page pairs. Besides, the memory management circuit is further configured for determining whether the first physical page is the upper physical page of the first physical page pair before writing the first data into the first physical page. When the first physical page is the upper physical page of the first physical page pair, the memory management circuit is further configured for determining whether a backup area stores second data before writing the first data into the first physical page, wherein the second data is already written into the lower physical page of the first physical page pair. When the backup area does not store the second data, the memory management circuit is further configured for reading the second data from the lower physical page of the first physical page pair and temporarily storing the second data into the backup area before writing the first data into the first physical page.

According to another exemplary embodiment of the present invention, a memory storage apparatus that includes a rewritable non-volatile memory module, a connector, and a memory controller is provided. The rewritable non-volatile memory module has a plurality of physical blocks, each of the physical blocks has a plurality of physical pages, the physical pages are grouped into a plurality of physical page pairs, each of the physical page pairs at least includes a lower physical page and an upper physical page and the speed of writing data into the lower physical page is faster than the speed of writing the data into the upper physical page. The connector is configured for coupling to the host system, and the memory controller is coupled to the rewritable non-volatile memory module and the connector. The memory controller is configured for receiving a write command and first data corresponding to the write command, and writing the first data into a first physical page of the physical pages, wherein the first physical page belongs to a first physical page pair among the physical page pairs. Besides, the memory controller is further configured for determining whether the first physical page is the upper physical page of the first physical page pair before writing the first data into the first physical page. When the first physical page is the upper physical page of the first physical page pair, the memory controller is further configured for determining whether a backup area stores second data before writing the first data into the first physical page, wherein the second data is already written into the lower physical page of the first physical page pair. When the backup area does not store the second data, the memory controller is further configured for reading the second data from the lower physical page of the first physical page pair and temporarily storing the second data into the backup area before writing the first data into the first physical page.

Based on the above, the data writing method, the memory controller, and the memory storage apparatus described in the embodiments of the present invention can reliably write data, thereby preventing data from losing due to the program failure.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings constituting a part of this specification are incorporated herein to provide a further understanding of the present invention. Here, the drawings illustrate embodiments of the present invention and, together with the description, serve to explain the principles of the present invention.

DESCRIPTION OF THE EMBODIMENTS

Figure 1A:
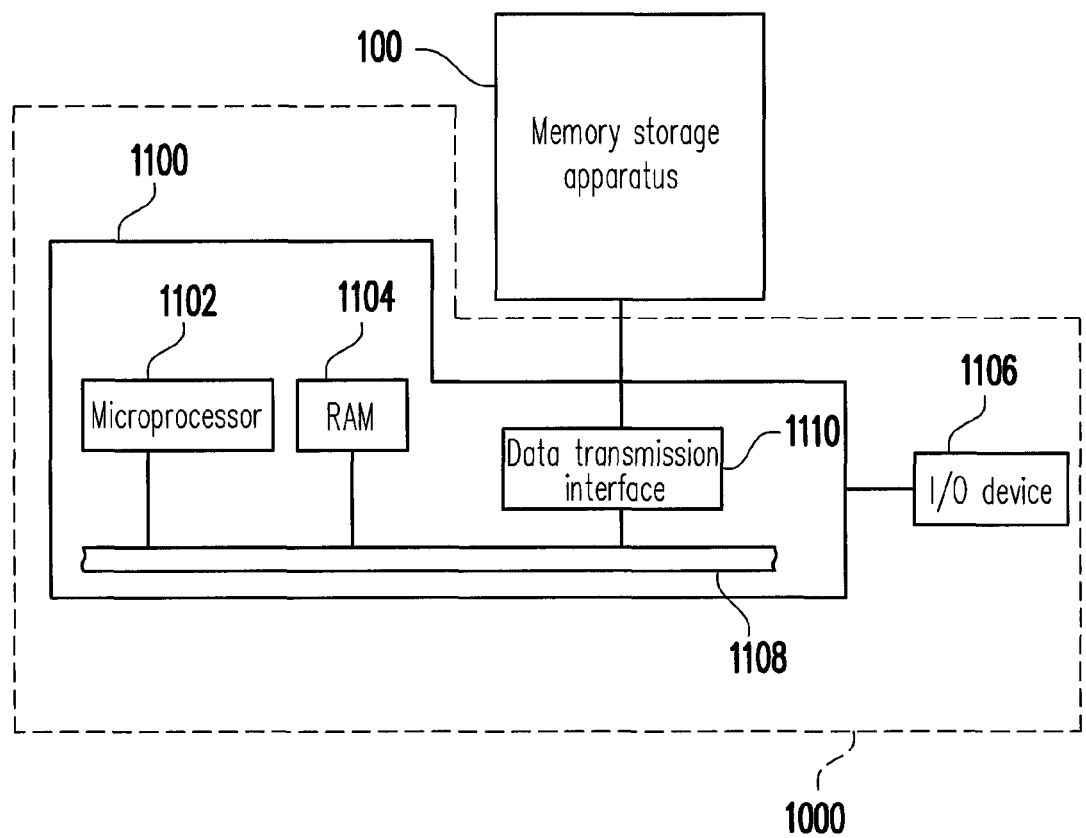
FIG. 1A illustrates a host system and a memory storage apparatus according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

A memory storage apparatus (i.e., a memory storage system) typically includes a rewritable non-volatile memory module and a controller (i.e., a control circuit). The memory storage apparatus is usually used together with a host system, such that the host system may write data into or read data from the memory storage apparatus.

FIG. 1A illustrates a host system and a memory storage apparatus according to a first exemplary embodiment of the present invention.

Figure 1B:
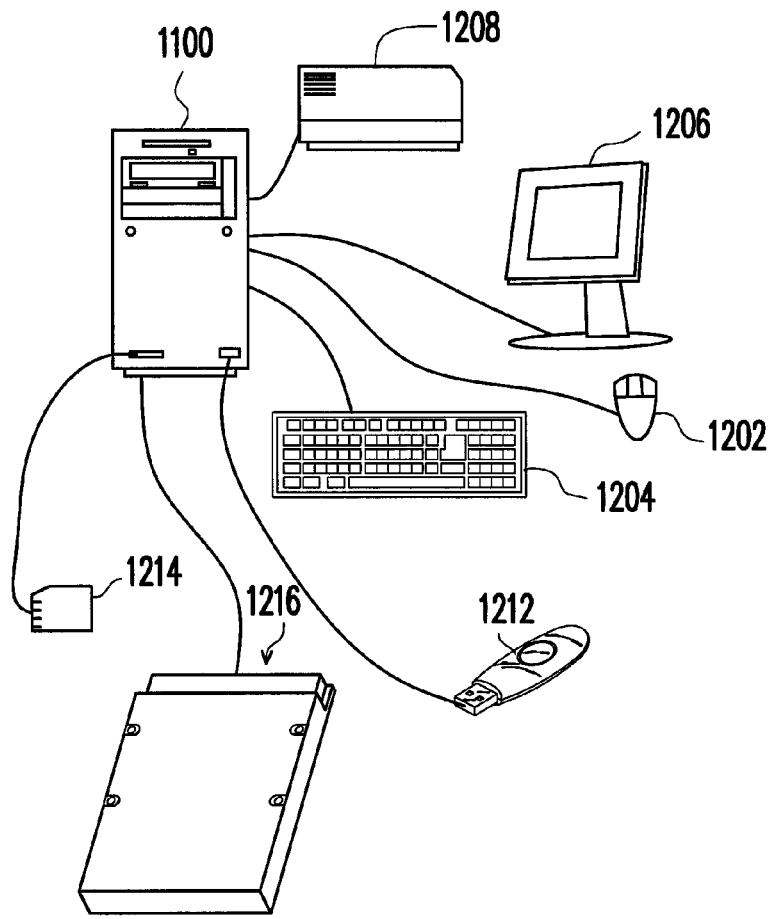
FIG. 1B schematically illustrates a computer, an input/output (I/O) device, and a memory storage apparatus according to the first exemplary embodiment of the present invention.

With reference to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. Note that the devices depicted in FIG. 1B should not be construed as limitations to the present invention, and the I/O device 1106 may include other devices as well.

In the exemplary embodiment of the present invention, the memory storage apparatus 100 is coupled to other devices of the host system 1000 through the data transmission interface 1110. By using the microprocessor 1102, the RAM 1104, and the I/O device 1106, the data may be written into or read from the memory storage apparatus 100. For instance, the memory storage apparatus 100 may be a rewritable non-volatile memory storage apparatus, such as a flash drive 1212, a memory card 1214, or a solid state drive (SSD) 1216 as shown in FIG. 1B.

Figure 1C:
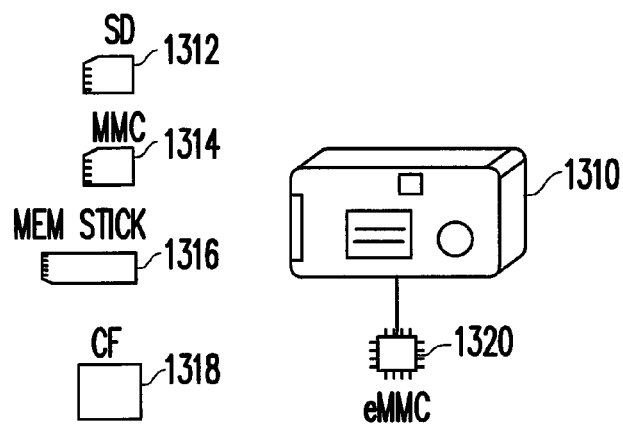
FIG. 1C schematically illustrates a host system and a memory storage apparatus according to another exemplary embodiment of the present invention.

Generally, the host system 1000 may substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so forth. For instance, if the host system is a digital camera (video camera) 1310, the rewritable non-volatile memory storage apparatus is an SD card 1312, an MMC 1314, a memory stick 1316, a CF card 1318, or an embedded storage apparatus 1320 (as shown in FIG. 1C). The embedded storage device 1320 includes an embedded MMC (eMMC). It should be mentioned that the eMMC is directly coupled to the substrate of the host system.

Figure 2:
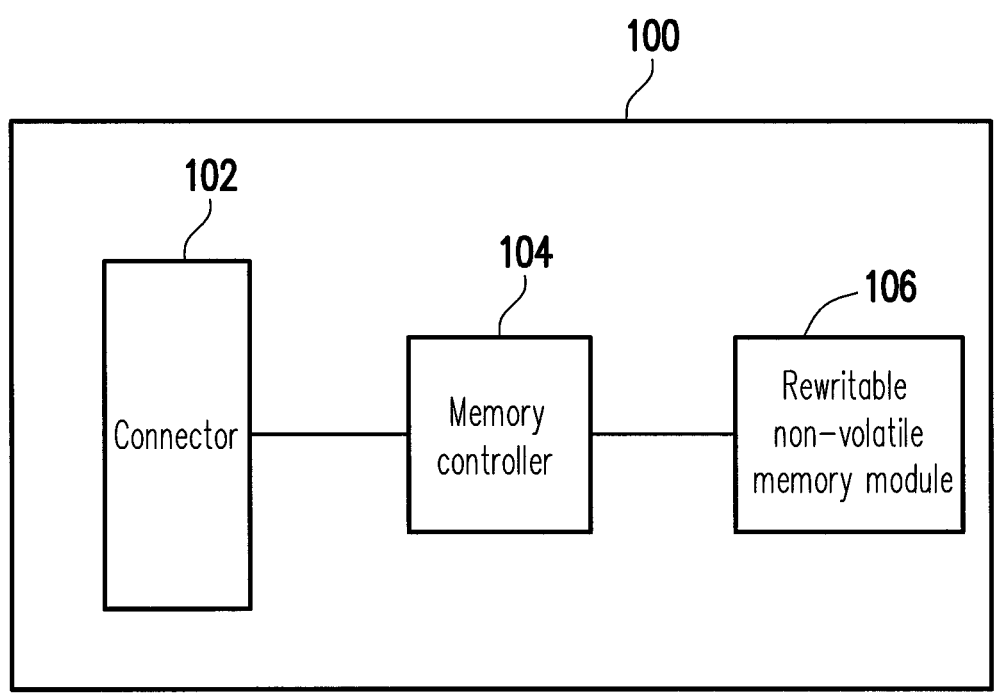
FIG. 2 is a schematic block diagram illustrating the memory storage apparatus depicted in FIG. 1A.

FIG. 2 is a schematic block diagram illustrating the memory storage apparatus depicted in FIG. 1A.

With reference to FIG. 2, the memory storage apparatus 100 includes a connector 102, a memory controller 104, and a rewritable non-volatile memory module 106.

In the present exemplary embodiment, the connector 102 complies with the serial advanced technology attachment (SATA) standard. However, the present invention is not limited thereto, and the connector 102 may also comply with the Institute of Electrical and Electronic Engineers (IEEE) 1394 standard, the parallel advanced technology attachment (PATA) standard, the peripheral component interconnect (PCI) express standard, the universal serial bus (USB) standard, the secure digital (SD) standard, the memory stick (MS) standard, the multi media card (MMC) standard, the compact flash (CF) standard, the integrated device electronics (IDE) standard, or other suitable standards.

The memory controller 104 is configured for executing a plurality of logic gates or control commands implemented in a form of hardware or firmware and performing various data operations in the rewritable non-volatile memory module 106 according to commands issued by the host system 1000, such as data writing, reading, erasing, merging, and so on.

The rewritable non-volatile memory module 106 is coupled to the memory controller 104 and has a plurality of physical blocks for storing data written by the host system 1000. According to this exemplary embodiment, each of the physical blocks has a plurality of physical pages, and the physical pages belonging to the same physical block may be written individually and must be erased simultaneously. For instance, in this exemplary embodiment, each of the physical blocks is constituted by 128 physical pages, and a capacity of each of the physical pages is 8 KB. Nevertheless, it should be understood that the present invention is not limited thereto.

In detail, each of the physical blocks is the smallest unit for erasing data. Namely, each of the physical blocks contains the least number of memory cells which are erased all together. Each of physical pages is the smallest unit for programming data. Namely, each of the physical pages is the smallest unit for updating data. However, it should be understood that in another exemplary embodiment, the smallest unit for updating data may be one sector or other size. Each physical page usually includes a data bit area and a redundant bit area. The data bit area is used for storing user data, and the redundant bit area is used for storing system data (e.g., error checking and correcting (ECC) codes).

In the present exemplary embodiment, the rewritable non-volatile memory module 106 is a multi level cell (MLC) NAND flash memory module. However, the present invention is not limited thereto, and the rewritable non-volatile memory module 106 may also be any other memory module having the same characteristics.

Figure 3:
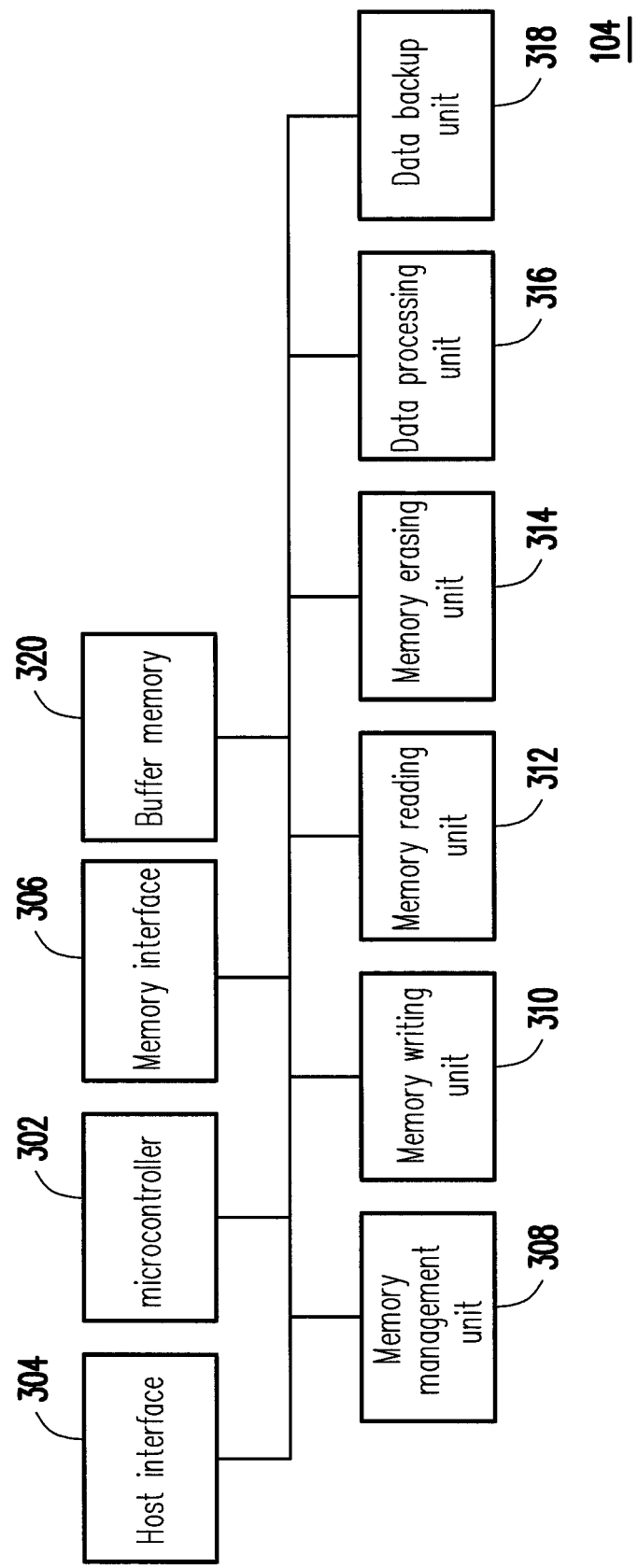
FIG. 3 is a schematic block diagram illustrating a memory controller according to the first exemplary embodiment of the present invention.

FIG. 3 is a schematic block diagram illustrating a memory controller according to the first exemplary embodiment of the present invention.

With reference to FIG. 3, the memory controller 104 includes a microcontroller 302, a host interface 304, a memory interface 306, and a memory management circuit having a memory management unit 308, a memory writing unit 310, a memory reading unit 312, a memory erasing unit 314, a data processing unit, a data backup unit 318, and a buffer memory 320.

The microcontroller 302 is configured for controlling the overall operation of the memory controller 104.

The host interface 304 is coupled to the memory management circuit and configured for receiving and identifying commands and data transmitted by the host system 1000. In the present exemplary embodiment, the host interface 304 complies with the SATA standard. However, the present invention is not limited thereto, and the host interface 304 may also comply with the PATA standard, the IEEE 1394 standard, the PCI Express standard, the USB standard, the SD standard, the MS standard, the MMC standard, the CF standard, the IDE standard, or any other appropriate data transmission standard.

The memory interface 306 is coupled to the memory management circuit and configured for accessing the rewritable non-volatile memory module 106. Namely, data to be written into the rewritable non-volatile memory module 106 is converted by the memory interface 306 into a format acceptable to the rewritable non-volatile memory module 106.

The memory management unit 308, the memory writing unit 310, the memory reading unit 312, the memory erasing unit 316, the data processing unit 316, and the data backup unit 318 are coupled to the microcontroller 302. The memory management unit 308 is configured for managing the physical blocks of the rewritable non-volatile memory module 106. The memory writing unit 310 is configured for giving a write command to the rewritable non-volatile memory module 106, so as to write data into the rewritable non-volatile memory module 106. The memory reading unit 312 is configured for giving a read command to the rewritable non-volatile memory module 106, so as to read data from the rewritable non-volatile memory module 106. The memory erasing unit 314 is configured for giving an erase command to the rewritable non-volatile memory module 106, so as to erase data from the rewritable non-volatile memory module 106. The data processing unit 316 is configured for processing data to be written into the rewritable non-volatile memory module 106 and data to be read from the rewritable non-volatile memory module 106. The data backup unit 318 is configured for backing up data written into the rewritable non-volatile memory module 106.

The buffer memory 320 is coupled to the microcontroller 302 and configured for temporarily storing data and commands received from the host system 1000 or data received from the rewritable non-volatile memory module 106. For instance, the buffer memory 320 may be a static random access memory (SRAM), a dynamic random access memory (DRAM), and so forth.

It should be understood that the memory controller depicted in FIG. 3 is merely exemplary and should not be construed as a limitation to the present invention. For instance, in addition to the microcontroller 302, the host interface 304, the memory interface 306, the memory management unit 308, the memory writing unit 310, the memory reading unit 312, the memory erasing unit 314, the data processing unit 316, the data backup unit 318, and the buffer memory 320, the memory controller 104 may further include a power management circuit and an error checking and correcting (ECC) circuit.

The power management circuit is coupled to the microcontroller 302 and configured for controlling the power of the memory storage apparatus 100.

The ECC circuit is coupled to the microcontroller 302 and configured for executing an error checking and correcting procedure to ensure data accuracy. Specifically, when the host interface 304 receives a write command from the host system 1000, the ECC circuit 212 generates an error checking and correcting (ECC) code for data (i.e., the updated data) corresponding to the write command, and the memory writing unit 310 writes the updated data and the corresponding ECC code into the rewritable non-volatile memory module 106. Subsequently, when the memory reading unit 312 reads the data from the rewritable non-volatile memory module 106, the memory reading unit 312 simultaneously reads the ECC code corresponding to the read data, and the ECC circuit executes the ECC procedure for the read data based on the ECC code.

Figure 4A:
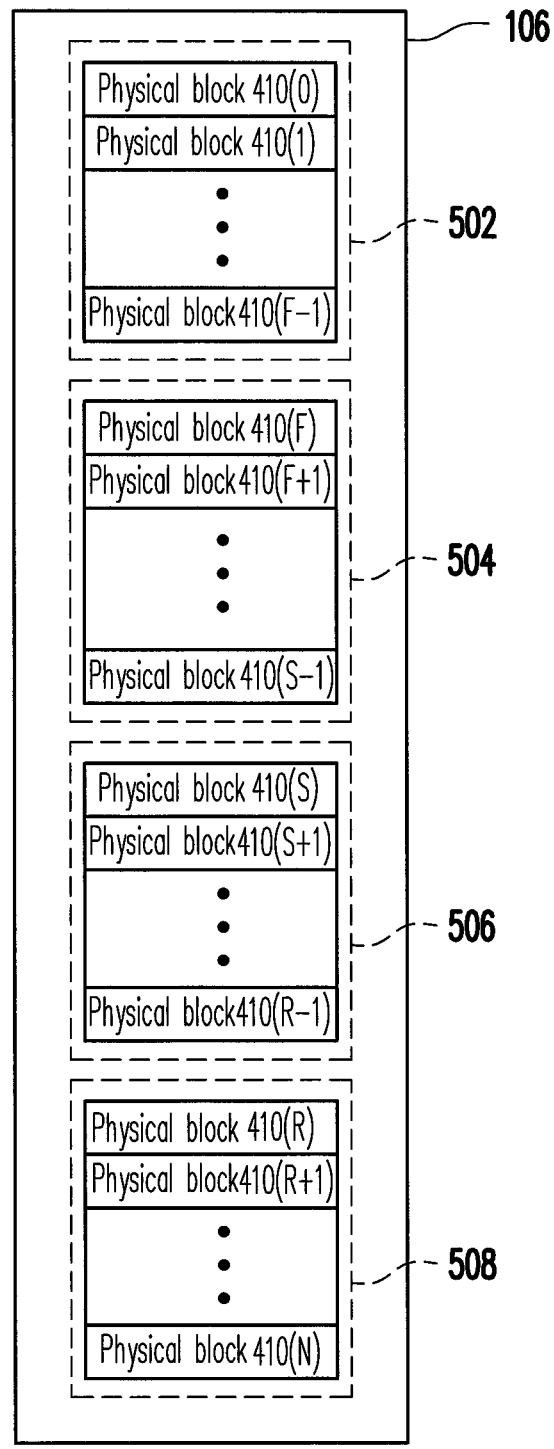
FIG. 4A and FIG. 4B are schematic diagrams of managing physical blocks in a rewritable non-volatile memory module according to the first exemplary embodiment of the present invention.
Figure 4B:
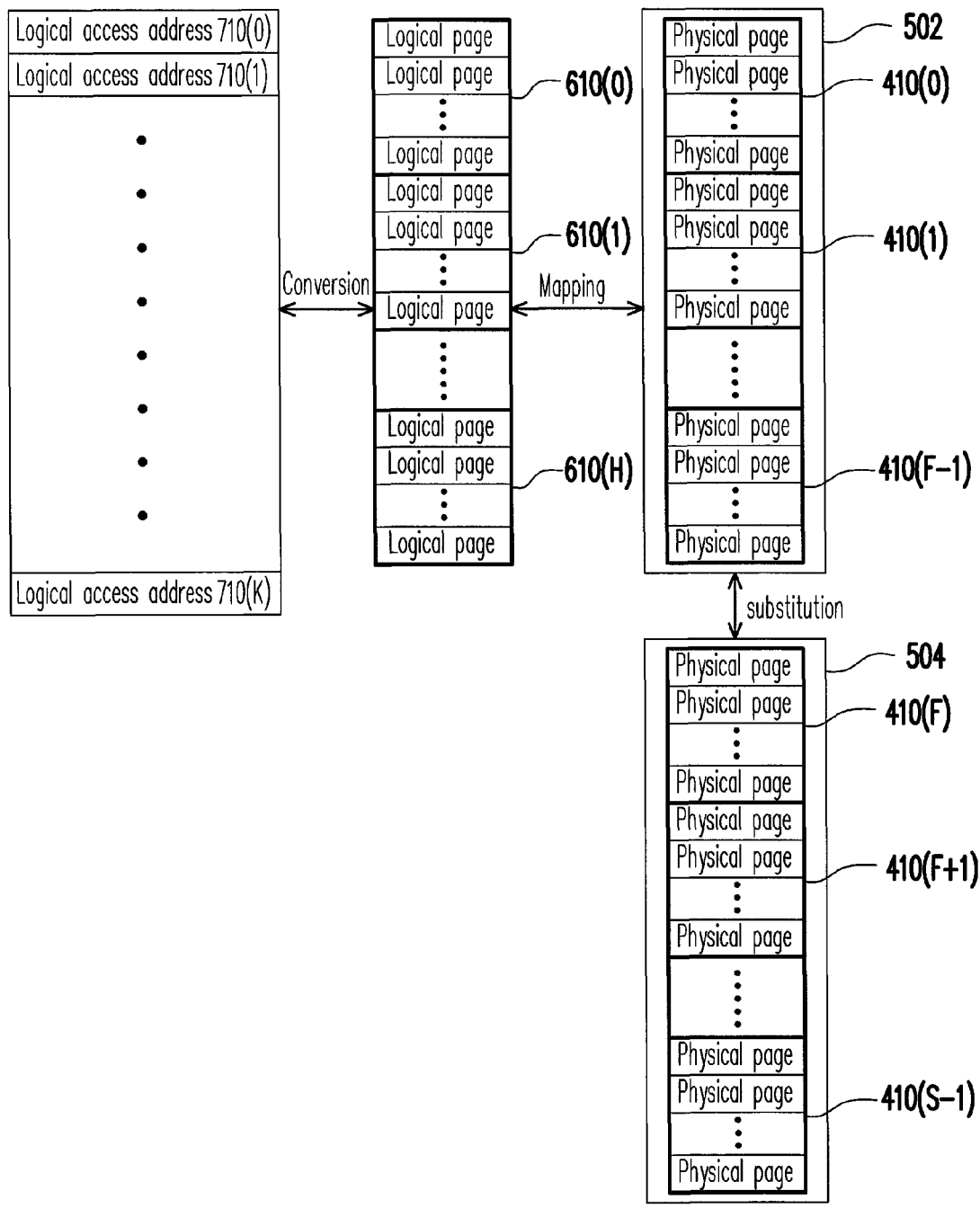

FIG. 4A and FIG. 4B are schematic diagrams of managing physical blocks in a rewritable non-volatile memory module according to the first exemplary embodiment of the present invention.

With reference to FIG. 4A, the rewritable non-volatile memory module 106 has physical blocks 410(0)~410(N), and the memory management unit 308 of the memory controller 104 logically groups the physical blocks 410(0)~410(N) into (or assigns the physical blocks 410(0)~410(N) as) a data area 502, a spare area 504, a system area 506, and a replacement area 508.

The physical blocks logically belonging to the data area 502 and the spare area 504 are used for storing data from the host system 1000. Specifically, the physical blocks (also referred to as data physical blocks) in the data area 502 are considered physical blocks already containing data, and physical blocks (also referred to as spare physical blocks) in the spare area 504 are physical blocks used for a new data writing operation. For instance, when a write command and data to be written are received from the host system 1000, the memory management unit 308 selects a physical block from the spare area 504, the data processing unit 316 organizes the data, and the memory writing unit 310 writes the data into the selected physical block. In addition, when a data merging procedure is to be executed on a logical block, the memory management unit 308 selects a physical block from the spare area 504 as a new data physical block corresponding to the logical block, the memory reading unit 312 reads the valid data belonging to the logical block from the rewritable non-volatile memory module 106, the data processing unit 316 organizes the valid data, the memory writing unit 310 writes the organized valid data into the new data physical block, and the memory management unit 308 re-maps the logical block to the new data physical block. To be more specific, after the data merging procedure is completed, the memory management unit 308 re-associates the data physical block storing the invalid data with the spare area 504, so as to perform a new data writing operation next time. For example, when the physical block is associated with the spare area 504, or when the physical block is selected from the spare area 504, the memory erasing unit 314 erases data in the physical block. Thereby, the selected physical block from the spare area 504 is a blank physical block for writing data.

The physical blocks logically belonging to the system area 506 are used for recording system data. For instance, the system data includes the manufacturers and models of the rewritable non-volatile memory module, the number of physical blocks in the rewritable non-volatile memory modules, the number of physical pages in each physical block, and so on.

Physical blocks logically belonging to the replacement area 508 are used in a bad physical block replacement procedure for replacing damaged physical blocks. Particularly, if there are still normal physical blocks of the replacement area 508, and a physical block in the data area 502 is damaged, the memory management unit 308 selects a normal physical block from the replacement area 508 to replace the damaged physical block.

Based on the above, during the operation of the memory storage apparatus 100, the physical blocks associated with the data area 502, the spare area 504, the system area 506, and the replacement area 508 are dynamically changed. For instance, the physical blocks used for alternatively storing data are dynamically associated with the data area 502 or the spare area 504.

It should be mentioned that the memory management unit 308 in the present exemplary embodiment manages the rewritable non-volatile memory module 106 in units of each physical block. However, the present invention is not limited thereto, and in another exemplary embodiment, the memory management unit 308 may also group the physical blocks into a plurality of physical units and manage the rewritable non-volatile memory module 106 in units of each physical unit. Each physical unit may be constituted by at least one physical block in the same memory die or in different memory dies, for instance.

As shown in FIG. 4B, the memory management unit 308 configures logical blocks 610(0)-610(H) for mapping to the physical blocks of the data area 502. Each of the logical blocks has a plurality of logical pages, and the logical pages are sequentially mapped to the physical pages in the corresponding data physical block. For instance, when the memory storage apparatus 100 is formatted, the logical blocks 610(0)-610(H) are initially mapped to the physical blocks 410(0)-410(F-1) in the data area 502.

In the present exemplary embodiment, the memory management unit 308 maintains a logical block-physical block mapping table to record the mapping relationship between the logical blocks 610(0)-610(H) and the physical blocks of the data area 502. In addition, the host system 1000 accesses data in units of logical access address. For instance, a logical access address is a logical sector. When the host system 1000 accesses data, the memory management unit 308 converts the logical access addresses 710(0)-710(K) corresponding to the memory storage apparatus 100 into addresses of the corresponding logical pages. For instance, when the host system 1000 is about to access a logical access address, the memory management unit 308 converts the logical access address accessed by the host system 1000 into a multi-dimensional address composed of the corresponding logical block, the corresponding logical page, and the corresponding logical offset, and the memory management unit 308 accesses data in the corresponding physical page according to the logical block-physical block mapping table. Here, an offset is used to define a logical (or a physical) address of a logical page (or a physical page), and the offset is defined as the distance between the logical (or the physical) address and the starting address of the logical page (or the physical page), wherein the logical (or the physical) address is also referred to as a logical (or a physical) offset address.

Figure 5:
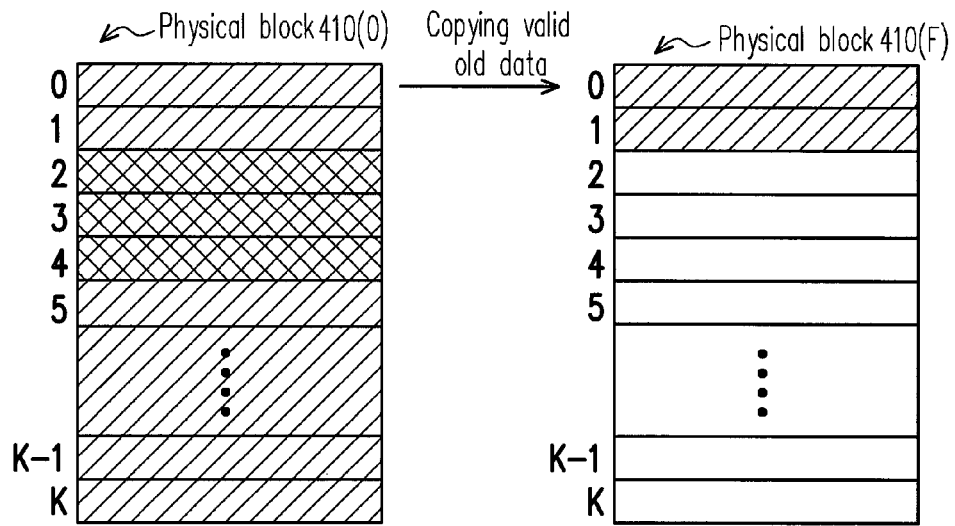
FIGS. 5-7 exemplarily illustrate an example of using child physical blocks to write updated data according to the first exemplary embodiment of the present invention.
Figure 6:
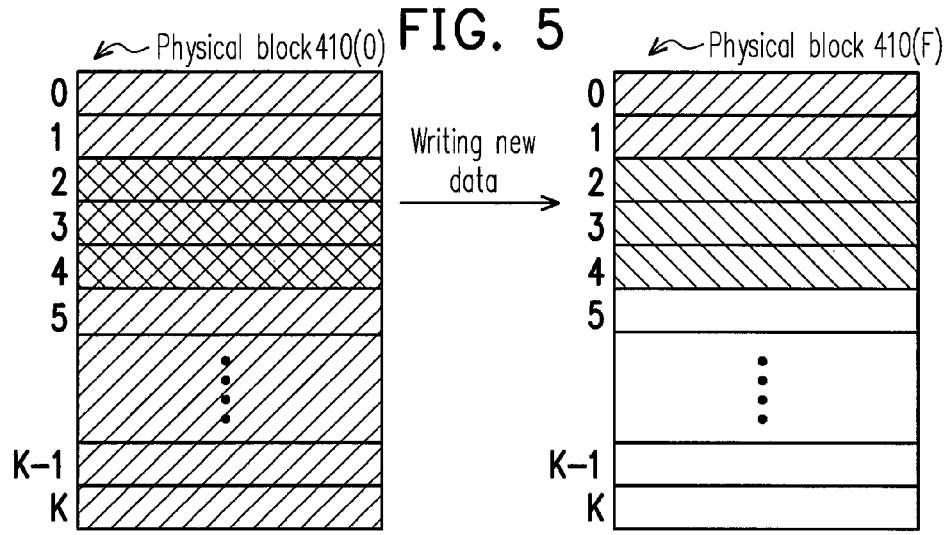
Figure 7:
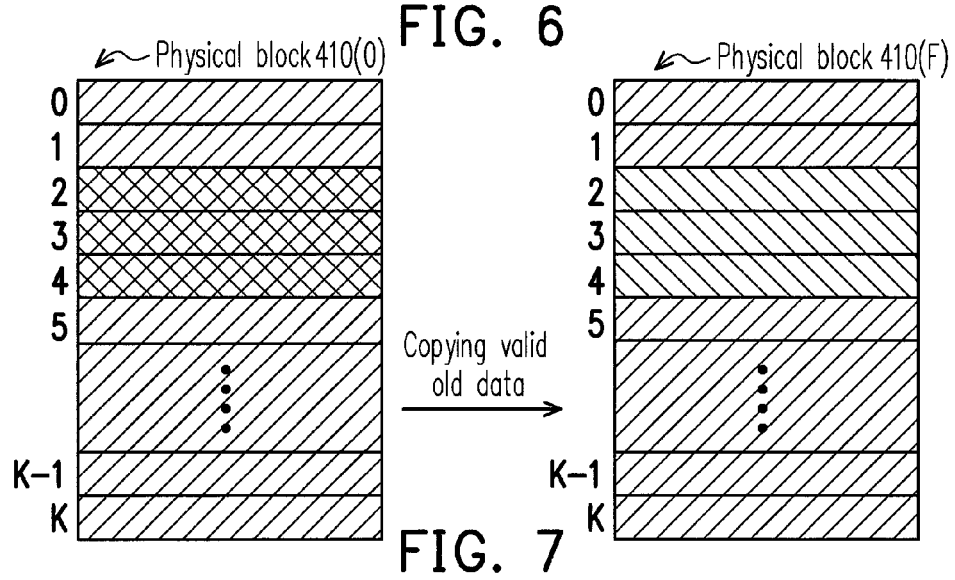

FIGS. 5-7 exemplarily illustrate an example of using child physical blocks to write updated data according to the first exemplary embodiment of the present invention.

With reference to FIGS. 5-7, for instance, when the logical block 610(0) is currently mapped to the physical block 410(0) and the memory controller 104 receives a write command from the host system 1000 for writing data into the logical pages belonging to the logical block 610(0), the memory controller 104 identifies that the logical block 610(0) is currently mapped to the physical block 410(0) based on the logical block-physical block mapping table and selects the physical block 410(F) from the spare area 504 for substituting the physical block 410(0). However, when the new data is written into the physical block 410(F), the memory controller 104 does not instantly move all the valid data in the physical block 410(0) to the physical block 410(F) or erase the physical block 410(0). Specifically, the memory reading unit 312 reads the valid data before the physical page to be written (i.e., data in the $0^{th}$ physical page and the $1^{st}$ physical page of the physical block 410(0)) from the physical block 410(0). After that, the memory writing unit 310 writes the valid data (before the physical page to be written) into the $0^{th}$ physical page and the $1^{st}$ physical page of the physical block 410(F) (as shown in FIG. 5) and writes the new data into the $2^{nd}$ physical page to the $4^{th}$ physical page of the physical block 410(F) (as shown in FIG. 6). At this time, the memory controller 104 completes the writing operation. Since the valid data in the physical block 410(0) may become invalid during the next operation (e.g., a write command), instantly moving all the valid data in the physical block 410(0) to the physical block 410(F) may become meaningless. Additionally, since data must be written sequentially into the physical pages of the physical blocks, the memory writing unit 310, the memory reading unit 312, and the data processing unit 316 merely move valid data before the physical page to be written (i.e., data stored in the $0^{th}$ physical page and the $1^{st}$ physical page of the physical block 410(0)) and do not move other valid data (i.e., data stored in the $5^{th}$~$K^{th}$ physical pages of the physical block 410(0)).

In the present exemplary embodiment, the operation of maintaining such a temporary relationship is referred to as opening mother-child blocks. Besides, the original physical block (e.g., the physical block 410(0)) is referred to as a "mother physical block", and the substitute physical block (e.g., the physical block 410(F)) for replacing the "mother physical block" is referred to as a "child physical block".

Thereafter, when the data of the physical blocks 410(0) and 410(F) are required to be merged, the memory controller 104 integrates the data in the physical blocks 410(0) and 410(F) into one single physical block, so that the efficiency of using physical blocks may be improved. Here, the operation of merging the mother-child blocks is referred to as a data merging procedure or as closing mother-child blocks. For instance, as shown in FIG. 7, while closing the mother-child blocks, the memory reading unit 312 reads the remaining valid data from the physical block 410(0) (i.e., data stored in the $5^{th}$~$K^{th}$ physical pages of the physical block 410(0)), the memory writing unit 310 writes the remaining valid data into the $5^{th}$~$K^{th}$ physical pages of the physical block 410(F), the memory erasing unit 314 then erases the physical block 410(0), and the memory management unit 308 associates the erased physical block 410(0) with the spare area 504 and associates the physical block 410(F) with the data area 502. That is to say, the memory management unit 308 re-maps the logical block 610(0) to the physical block 410(F) in the logical block-physical block mapping table. Additionally, in the present exemplary embodiment, the memory management unit 308 establishes a spare area physical block table (not shown) for recording the physical blocks currently associated with the spare area 504. It should be noted that the physical blocks of the spare area 504 is limited. Accordingly, during the operation of the memory storage apparatus 100, the number of the currently-opened mother-child block sets is limited as well. As such, when the memory storage apparatus 100 receives a write command from the host system 1000, and the number of the currently-opened mother-child block sets reaches the maximum value, the memory controller 104 must close one of the currently-opened mother-child block sets in order to execute the write command.

In addition to writing update data by using a child physical block, the memory management unit 308 in the present exemplary embodiment further selects at least one physical block from the spare area 504 as a random physical block to write the update data.

Figure 8:
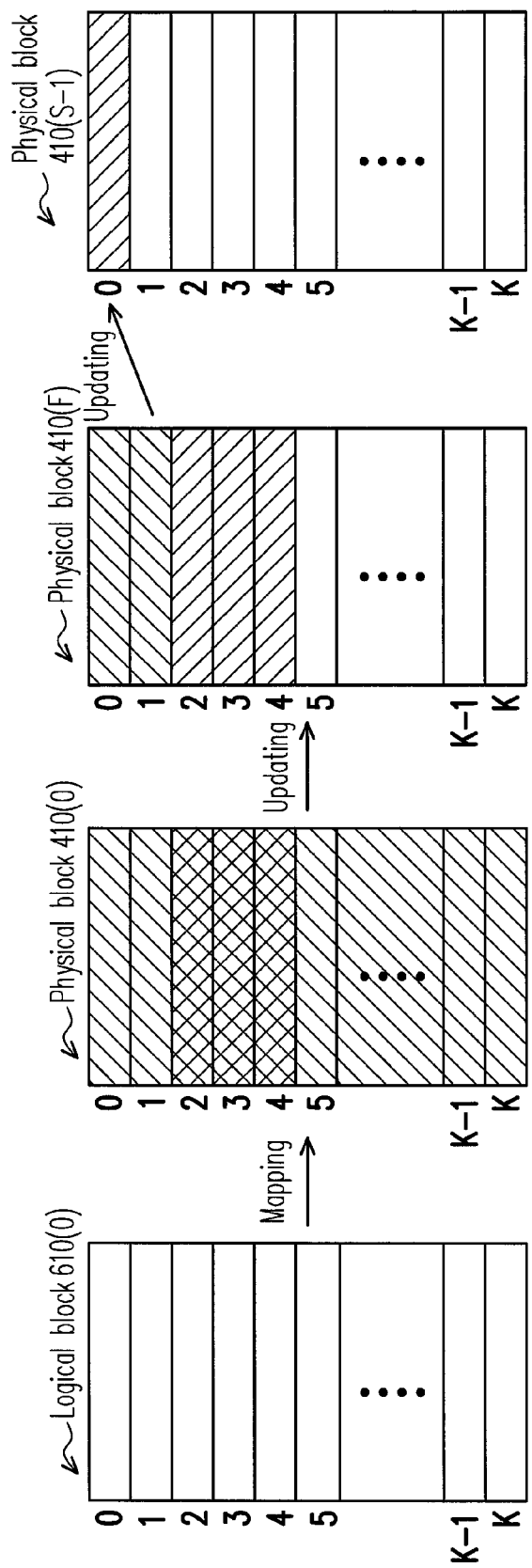
FIG. 8 schematically illustrates an example of using random physical blocks to write data according to the first exemplary embodiment of the present invention.

FIG. 8 schematically illustrates an example of using random physical blocks to write data according to the first exemplary embodiment of the present invention.

With reference to FIG. 8, if a physical block 410(S-1) is selected as a random physical block, and the host system 1000 is about to write update data into the $1^{st}$ logical page of the logical block 610(0) in the storage state illustrated in FIG. 6, the memory writing unit 310 writes the update data into the first blank physical page of the random physical block (e.g., the $0^{th}$ physical page of the physical block 410(S-1)).

In the present exemplary embodiment, when the current random physical block is full, the memory management unit 308 selects another physical block from the spare area 504 as a new random physical block until the number of physical blocks which serve as the random physical blocks is less than a predetermined value. In particular, the number of physical blocks in the spare area 504 is limited, and therefore the number of physical blocks which act as the random physical blocks is also limited. When the number of physical blocks in the spare area 504 reaches the predetermined value, the memory management unit 308, the memory writing unit 310, the memory reading unit 312, and the memory erasing unit 314 collectively execute the aforementioned data merging operation to erase the random physical blocks merely containing invalid data and associate the erased physical blocks with the spare area 504. Accordingly, when the next write command is executed, the memory management unit 308 may again select a blank physical block as a random physical block from the spare area 504.

It should be mentioned that although the data of the logical page to be updated by the host system 1000 is already written into a child physical block, as exemplarily shown in FIG. 8, the way to utilize the random physical block is not limited herein. For instance, in another exemplary embodiment of the present invention, the memory writing unit 310 may directly write the updated data from the host system 100 into a random physical block. Thereafter, the memory management unit 308, the memory writing unit 310, the memory reading unit 312, and the memory erasing unit 314 collectively merge the valid data (belonging to one logical block) into a blank physical block selected from the spare area 504.

Figures 9A, 9B:
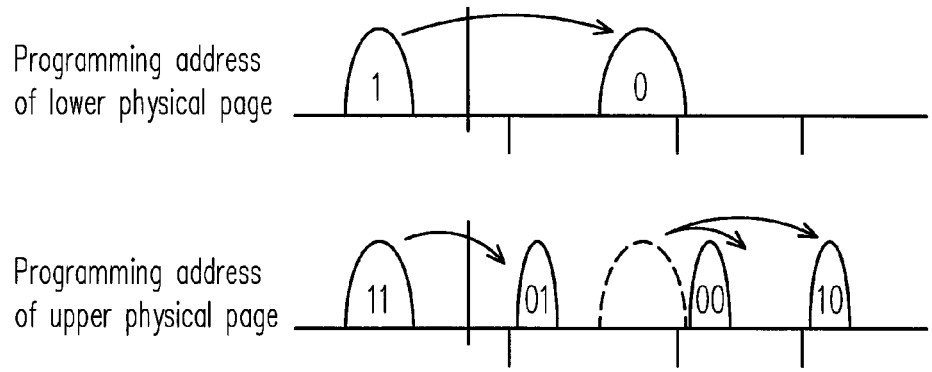
FIG. 9A is a schematic diagram illustrating 2-phase programming of a 4-level NAND flash memory according to an exemplary embodiment of the present invention.
FIG. 9B schematically illustrates physical pages of a physical block according to the first exemplary embodiment of the present invention.

In this exemplary embodiment, the rewritable non-volatile memory module 106 is an MLC NAND flash memory module. To be more specific, the NAND flash memory module may be classified into an MLC NAND flash memory module and a SLC NAND flash memory module. Each memory cell in the SLC NAND flash memory module may merely store one bit of data, while each memory cell in the MLC NAND flash memory module may store at least two bits of data. For instance, in an exemplary 4-level cell NAND flash memory module, each memory cell may store 2 bits of data (i.e., "11," "10," "00," or "01"). Thereby, writing data into the 4-level cell NAND flash memory module may be divided into two phases. The first phase lies in writing data into a lower physical page, and the second phase lies in writing data into an upper physical page, as shown in FIG. 9A. The speed of writing data into the lower physical page is faster than writing data into the upper physical page. Therefore, physical pages in each physical block in the MLC NAND flash memory module may be categorized into slow physical pages (i.e., upper physical pages) and fast physical pages (i.e., lower physical pages). Compared to the upper physical pages, the lower physical pages have relatively high storage reliability. Similarly, in an exemplary 8-level cell NAND flash memory module or an exemplary 16-level cell NAND flash memory module, the memory cells may store more bits of data, and the data writing operation may be performed in more phases. For instance, in an 8-level cell NAND flash memory module, physical pages in each physical block may be categorized into slow physical pages (i.e., upper physical pages), middle-speed physical pages (i.e., middle physical pages), and fast physical pages (i.e., lower physical pages).

FIG. 9B schematically illustrates physical pages of a physical block according to the first exemplary embodiment of the present invention. In FIG. 9B, configuration of physical pages in physical blocks in a 4-level cell flash memory module is illustrated.

With reference to FIG. 9B, each physical block has 127 physical pages, and the physical pages are grouped into a plurality of physical page pairs 900(0)~900(63) which are sequentially arranged. Each of the physical page pairs is constituted by one upper physical page and one lower physical page.

It should be mentioned that the physical pages of one physical page pair are constituted by one memory cell set, and the upper physical page of the physical page pair is programmed after the lower physical page of the physical page pair is completely programmed, as shown in FIG. 9A. Therefore, if there is a program failure in the upper physical page, the data stored in the lower physical page may be lost.

To prevent the data loss in the lower physical page due to the program failure of the upper physical page, in the present exemplary embodiment, before the memory writing unit 310 writes data (hereinafter referred to as a first data) into a physical page (hereinafter referred to as a first physical page) in a physical block (e.g., the aforesaid child physical block or random physical block), the data backup unit 318 determines whether the first physical page is the upper physical page. When the physical page into which the data is to be written by the memory writing unit 310 is the upper physical page, the data backup unit 318 determines whether a backup area stores data (hereinafter referred to as second data) written in a lower physical page (hereinafter referred to as a corresponding lower physical page) of the physical page pair. When the backup area does not store the second data written into the corresponding lower physical page, the data backup unit 318 instructs the data reading unit 312 to read the second data from the corresponding lower physical page and temporarily store the read second data into the backup area. After the backup area is ensured to store the second data written into the corresponding lower physical page, the memory writing unit 310 programs the first physical page in order to write the first data into the first physical page.

After the first data is written into the first physical page, the memory management unit 308 determines whether a program failure occurs in the first physical page. Specifically, when the program failure occurs in the first physical page, the memory management unit 308 re-selects another physical page pair, and the memory writing unit 310 writes the first data and the second data into the re-selected physical page pair.

For instance, as shown in FIG. 9A, before the memory writing unit 310 writes data into the ninth physical page, the data backup unit 318 determines whether the backup area stores data already written into the third physical page. Given that the backup area does not store the data written into the third physical page, the data backup unit 318 instructs the data reading unit 312 to read the data from the third physical page and temporarily store the read data into the backup area.

In the present exemplary embodiment, the backup area is the buffer memory 320. However, the present invention is not limited thereto; in another exemplary embodiment of the present invention, the memory management unit 308 may select at least one physical block from the spare area 504 or the system area 506 as the backup area.

Based on the above, when the memory controller 104 described in the present exemplary embodiment writes data into the rewritable non-volatile memory module 106, the reliability of the written data may be guaranteed effectively.

It should be mentioned that even though a 4-level cell flash memory module is exemplified in the present exemplary embodiment to explain the present invention, the present invention is not limited thereto. For instance, in an exemplary 8-level cell flash memory module, the data backup unit 318 further backs up data in the middle physical page. In particular, when data is written into an upper physical page of one physical page pair, the data backup unit 318 not only temporarily stores data in the lower physical page of the physical page pair into the backup area but also determines whether the backup area stores the data in the middle physical page of the physical page pair. Moreover, given that the backup area does not store the data in the middle physical page of the physical page pair, the data backup unit 318 further temporarily stores the data in the middle physical page of the physical page pair into the backup area.

Second Exemplary Embodiment

The structure of the memory storage apparatus described in the second exemplary embodiment is substantially the same as that of the memory storage apparatus described in the first exemplary embodiment, while the difference therebetween is that the memory controller described in the second exemplary embodiment further backs up the data already written into other lower physical pages. The elements disclosed in the first exemplary embodiment are further utilized hereinafter to elaborate the difference between the first and second exemplary embodiments.

As described above, given that there is a program failure in an upper physical page of one physical page pair, data stored in the lower physical page of the same physical page pair may be lost. Specifically, in some cases, data stored in other lower physical pages adjacent to the aforesaid lower physical page may be lost as well.

To resolve said issue, according to the second exemplary embodiment, when the data in the corresponding lower physical page is temporarily stored in the backup area, the data backup unit 318 further determines whether the backup area stores data (hereinafter referred to as third data) in other lower physical pages adjacent to the corresponding lower physical page. Given that the backup area does not store the third data, the data backup unit 318 further instructs the data reading unit 312 to read the data from other lower physical pages adjacent to the corresponding lower physical page and temporarily store the read data into the backup area.

For instance, as shown in FIG. 9A, before the memory writing unit 310 writes data into the ninth physical page, the data backup unit 318 determines whether the backup area stores data already written into the third physical page. Given that the backup area does not store the data written into the third physical page, the data backup unit 318 instructs the data reading unit 312 to read the data from the third physical page and temporarily store the read data into the backup area. Then, the data backup unit 318 further determines whether the backup area stores data already written into the second physical page. Given that the backup area does not store the data already written into the second physical page, the data backup unit 318 instructs the data reading unit 312 to read the data from the second physical page and temporarily store the read data into the backup area. Even though one lower physical page is exemplified in the present embodiment in order to explain the present invention, it should be understood that the present invention is not limited thereto. According to another exemplary embodiment of the present invention, the data backup unit 318 may determine whether the backup area stores data of other lower physical pages (e.g., the $2^{nd}$, $1^{st}$, and $0^{th}$ physical pages) and back up the data of other lower physical pages, so as to ensure that the data may be recovered in the event of data loss.

In the present exemplary embodiment, after the data in the lower physical page corresponding to the upper physical page into which the data is to be written is temporarily stored into the backup area, the data backup unit 318 backs up data written in other lower physical pages adjacent to the corresponding lower physical page. However, it should be mentioned that the present invention is not limited to the above. In another exemplary embodiment, before writing data into an upper physical page of one physical page pair, the data backup unit 318 not only temporarily stores data written in the lower physical page of the physical page pair into the backup area but also determines whether the backup area contains data written in other physical page pairs arranged before the physical page pair (e.g., one physical page pair arranged before the physical page pair). Moreover, given that the backup area does not contain the data written in other physical page pairs arranged before the physical page pair, the data backup unit 318 further temporarily stores the data written in other physical page pairs arranged before the physical page pair into the backup area. That is to say, data, which is stored other physical page pairs and may be lost due to the programming of one upper physical page, are temporarily stored in the backup area.

Third Exemplary Embodiment

In the first exemplary embodiment, the memory management unit, the memory writing unit, the memory reading unit, the memory erasing unit, the data processing unit, and the data backup unit are implemented in a form of hardware, which should not be construed as a limitation to the present invention. In the third exemplary embodiment, the functions of the memory management unit, the memory writing unit, the memory reading unit, the memory erasing unit, the data processing unit, and the data backup unit may be implemented in a form of firmware.

For instance, control instructions for performing the functions of the memory management unit, the memory writing unit, the memory reading unit, the memory erasing unit, the data processing unit, and the data backup unit may be burned into a read-only memory of the memory controller. When the memory storage apparatus 100 is in operation, the control instructions are executed by the microcontroller.

Besides, in another exemplary embodiment of the present invention, the control instructions for performing the functions of the memory management unit, the memory writing unit, the memory reading unit, the memory erasing unit, the data processing unit, and the data backup unit may also be stored in a specific area of the rewritable non-volatile memory module (e.g., in a system area exclusively used for storing system data in a the rewritable non-volatile memory module) as program codes. For instance, a read-only memory (not shown) and a RAM (not shown) are configured in the memory controller, and the read-only memory has boot codes. When the memory controller is enabled, the microcontroller first executes the boot codes to load the control instructions stored in the rewritable non-volatile memory module into the RAM and then executes the control commands.

Namely, the data writing operation disclosed in the first exemplary embodiment may also be performed in a form of a program code. A detailed description of operation of the program code is provided below with reference to the accompanying flowchart.

Figure 10:
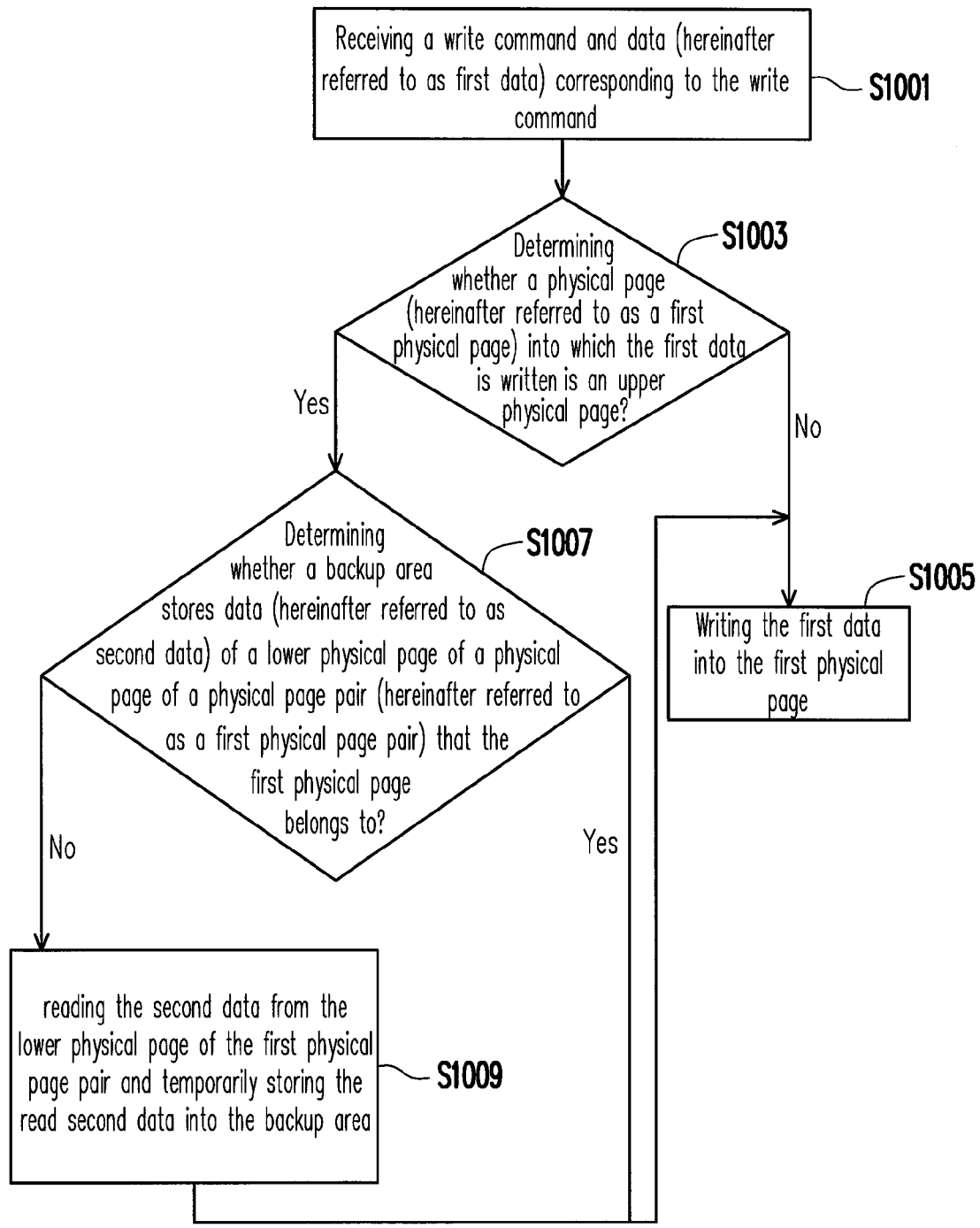
FIG. 10 is a flowchart illustrating a data writing method according to a third exemplary embodiment of the present invention.

FIG. 10 is a flowchart illustrating a data writing method according to a third exemplary embodiment of the present invention.

With reference to FIG. 10, in step S1001, a write command and data (hereinafter referred to as first data) corresponding to the write command are received.

In step S1003, it is determined whether a physical page (hereinafter referred to as a first physical page) into which the first data is written is an upper physical page.

If the first physical page is not the upper physical page, the first data is written into the first physical page in step S1005. Specifically, a program command for writing the first data into the first physical page is transmitted to the rewritable non-volatile memory module 106.

If the first physical page is the upper physical page, in step S1007, it is determined whether the backup area stores data (hereinafter referred to as second data) written in a lower physical page of a physical page pair (hereinafter referred to as a first physical page pair) which the first physical page belongs to.

If the backup area stores the second data, the step S1005 is performed.

By contrast, if the backup area does not store the second data, in step S1009, the second data is read from the lower physical page of the first physical page pair, and the read second data is temporarily stored into the backup area. After that, the step S1005 is performed.

It should be mentioned that the process depicted in FIG. 10 may further include determining whether a program failure occurs in the first physical page after the step S1005 is performed. When the program failure occurs in the first physical page, the first data and the second data are written into another physical page pair. For instance, another physical page pair (hereinafter referred to as a second physical page pair) is selected, the first data is written into the lower physical page of the second physical page pair, and the second data is written into the upper physical page of the second physical page pair.

Figure 11:
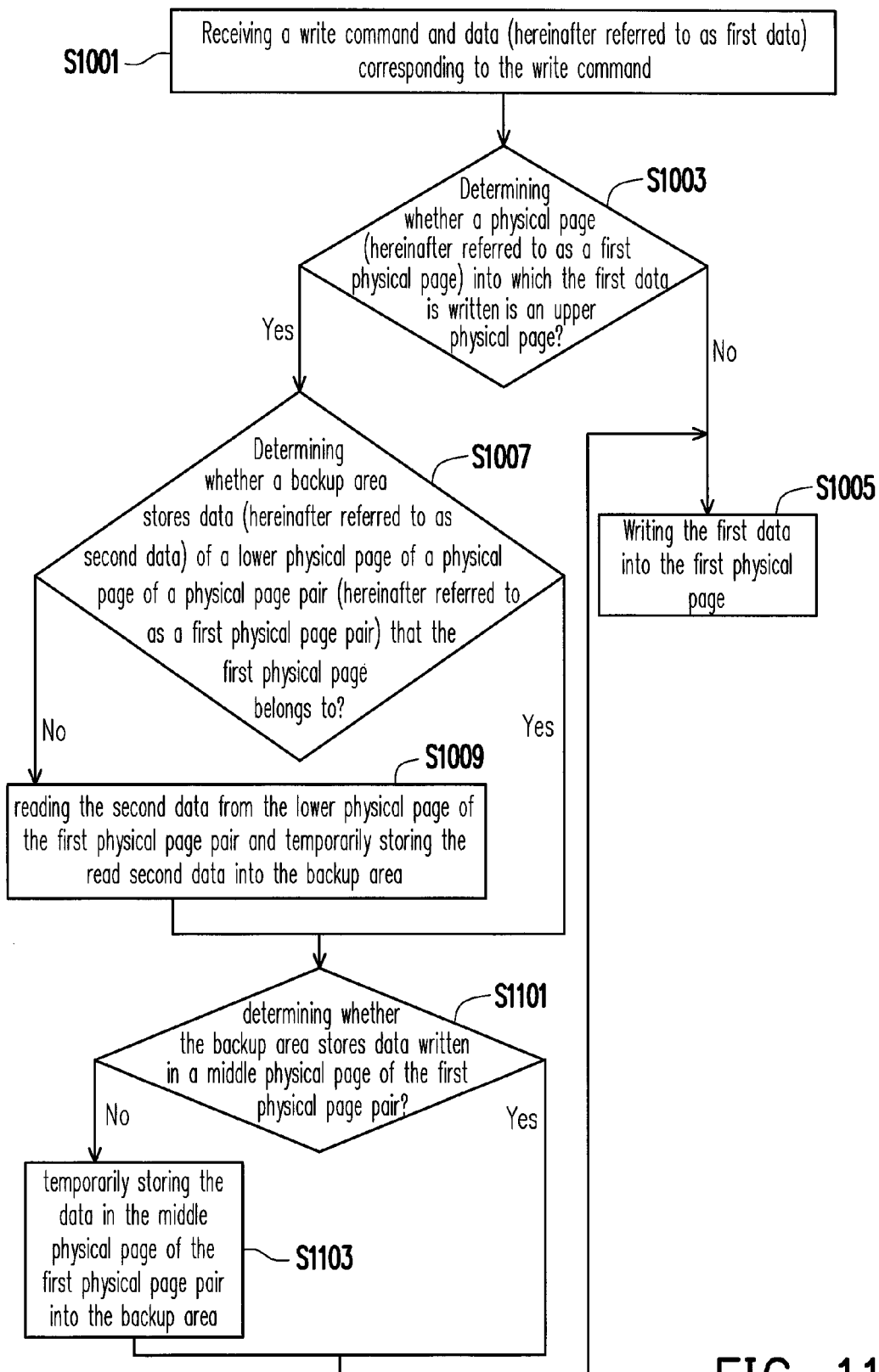
FIG. 11 is a flowchart illustrating a data writing method according to another embodiment of the present invention.

Even though a 4-level cell flash memory module is exemplified in the present exemplary embodiment to explain the present invention, the present invention is not limited thereto. For instance, in an exemplary 8-level cell flash memory module, the process depicted in FIG. 10 may further include determining whether the backup area stores data in a middle physical page of the first physical page pair (in step S1101 shown in FIG. 11) before the data is written into the upper physical page of the first physical page pair. Moreover, given that the backup area does not store the data in the middle physical page of the first physical page pair, the data written in the middle physical page of the first physical page pair is temporarily stored into the backup area (in step S1103 shown in FIG. 11).

Fourth Exemplary Embodiment

In the second exemplary embodiment, the memory management unit, the memory writing unit, the memory reading unit, the memory erasing unit, the data processing unit, and the data backup unit are implemented in a form of hardware, which should not be construed as a limitation to the present invention. In the fourth exemplary embodiment, the functions of the memory management unit, the memory writing unit, the memory reading unit, the memory erasing unit, the data processing unit, and the data backup unit may be implemented in a form of firmware.

Namely, the data writing operation disclosed in the second exemplary embodiment may also be performed in a form of a program code. A detailed description of operation of the program code is provided below with reference to the accompanying flowchart.

Figure 12:
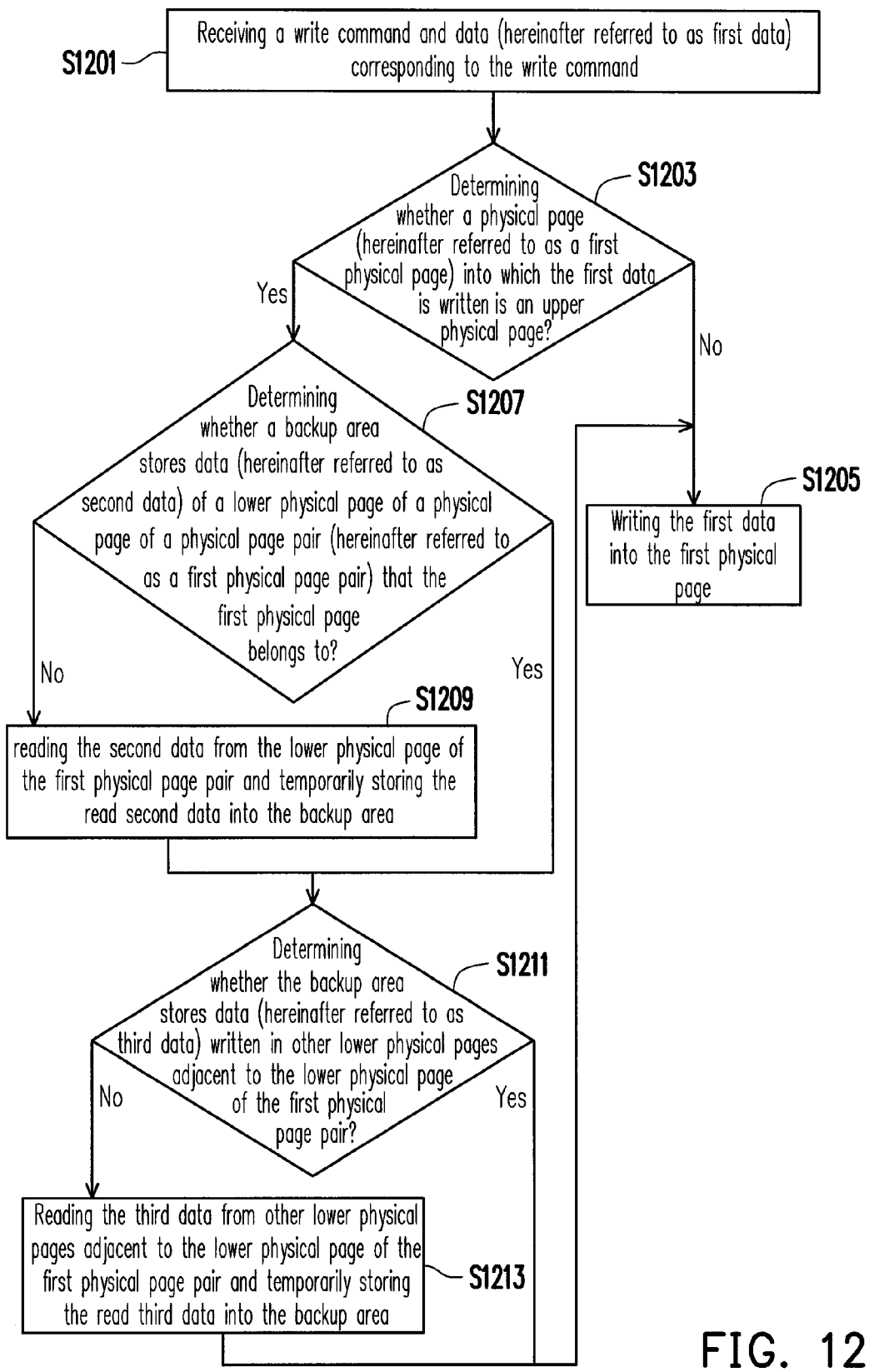
FIG. 12 is a flowchart illustrating a data writing method according to a fourth exemplary embodiment of the present invention.

FIG. 12 is a flowchart illustrating a data writing method according to a fourth exemplary embodiment of the present invention.

With reference to FIG. 12, in step S1201, a write command and data (hereinafter referred to as first data) corresponding to the write command are received.

In step S1203, it is determined whether a physical page (hereinafter referred to as a first physical page) into which the first data is written is an upper physical page.

If the first physical page is not the upper physical page, the first data is written into the first physical page in step S1205. Specifically, a program command for writing the first data into the first physical page is transmitted to the rewritable non-volatile memory module 106.

If the first physical page is the upper physical page, in step S1207, it is determined whether the backup area stores data (hereinafter referred to as second data) in a lower physical page of a physical page pair (hereinafter referred to as a first physical page pair) which the first physical page belongs to.

If the backup area stores the second data, the step S1205 is performed.

By contrast, if the backup area does not store the second data, in step S1209, the second data is read from the lower physical page of the first physical page pair, and the read second data is temporarily stored into the backup area.

In step S1211, it is determined whether the backup area stores data (hereinafter referred to as third data) written in other lower physical pages adjacent to the lower physical page of the first physical page pair.

If the backup area stores the third data, the step S1205 is performed.

By contrast, if the backup area does not store the third data, in step S1213, the third data is read from other lower physical pages adjacent to the lower physical page of the first physical page pair, and the read third data is temporarily stored into the backup area. After that, the step S1205 is performed.

Figure 13:
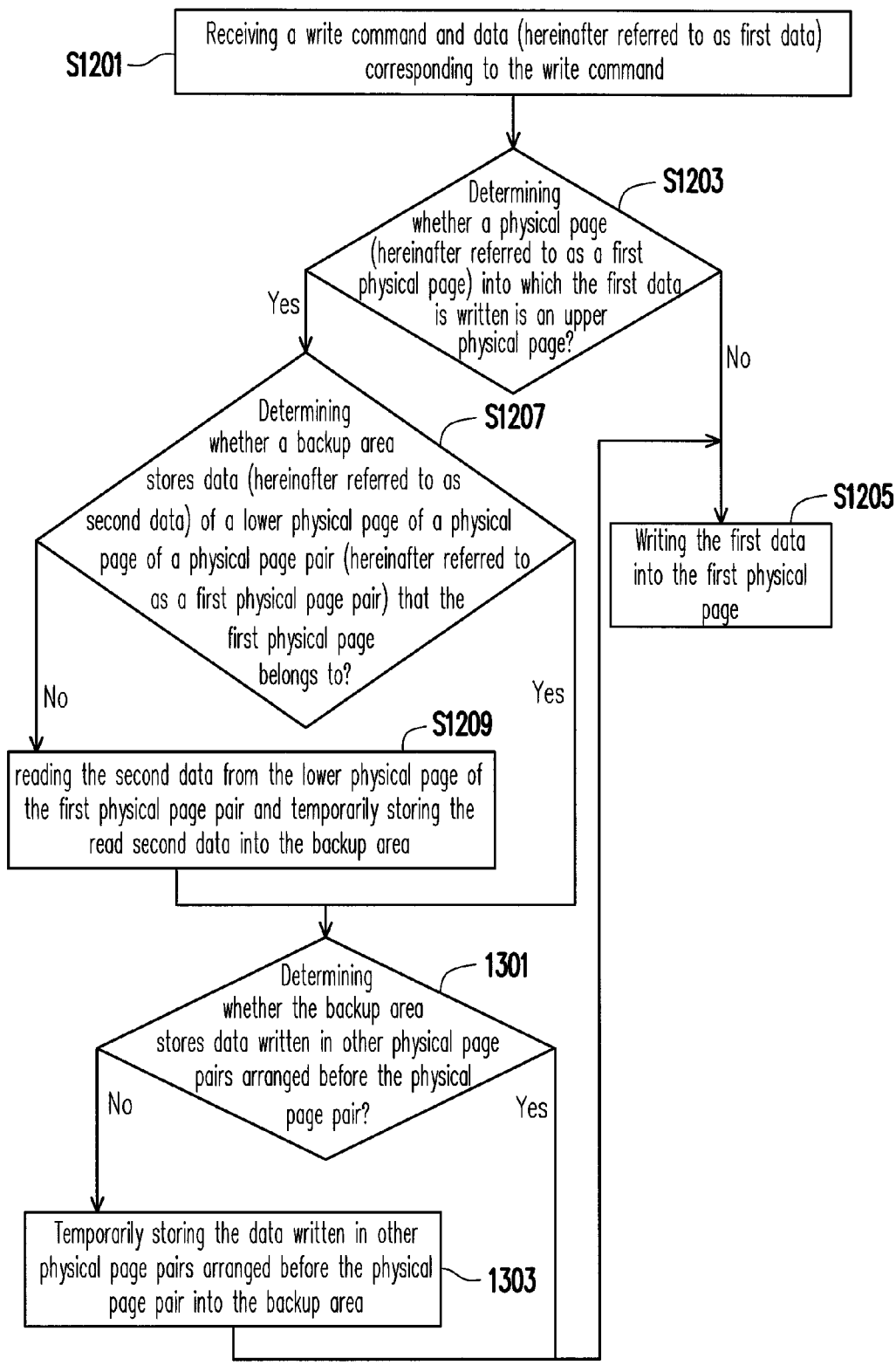
FIG. 13 is a flowchart illustrating a data writing method according to another embodiment of the present invention.

According to the present exemplary embodiment, after the data written in the lower physical page corresponding to the upper physical page into which the data is to be written is temporarily stored into the backup area, the data written in other lower physical pages adjacent to the corresponding lower physical page are backed up. However, it should be mentioned that the present invention is not limited to the above. For instance, in another exemplary embodiment as shown in FIG. 13, the data writing process may further include determining whether the backup area stores data written in other physical page pairs arranged before the physical page pair (e.g., one physical page pair preceding the physical page pair) (step S1301). Moreover, given that the backup area does not store the data in other physical page pairs arranged before the physical page pair, the data written in other physical page pairs arranged before the physical page pair are temporarily stored into the backup area (step S1303).

In light of the foregoing, in the data writing method, the memory controller and the memory storage apparatus described in the exemplary embodiments of the present invention, reliability of data may be ensured when the data are written into the rewritable non-volatile memory module. The previously described exemplary embodiments of the present invention have the advantages aforementioned, wherein the advantages aforementioned not required in all versions of the invention.

Although the present invention has been described with reference to the above embodiments, it will be apparent to one of the ordinary skill in the art that modifications to the described embodiment may be made without departing from the spirit of the present invention. Accordingly, the scope of the present invention will be defined by the attached claims not by the above detailed descriptions.

What is claimed is:

1. A data writing method for a rewritable non-volatile memory module, wherein the rewritable non-volatile memory module has a plurality of physical blocks, each of the physical blocks has a plurality of physical pages, the physical pages are grouped into a plurality of physical page pairs, each of the physical page pairs at least has a lower physical page and an upper physical page, a speed of writing data into the lower physical page is faster than a speed of writing the data into the upper physical page, and the data writing method comprises:

receiving a write command and first data corresponding to the write command;

writing the first data into a first physical page among the physical pages, wherein the first physical page belongs to a first physical page pair among the physical page pairs;

determining whether the first physical page is the upper physical page of the first physical page pair before writing the first data into the first physical page;

when the first physical page is the upper physical page of the first physical page pair, determining whether a backup area stores second data before writing the first data into the first physical page, wherein the second data has written into the lower physical page of the first physical page pair;

when the backup area does not store the second data, reading the second data from the lower physical page of the first physical page pair and temporarily storing the second data into the backup area before writing the first data into the first physical page;

when the first physical page is the upper physical page of the first physical page pair, determining whether the backup area stores third data before writing the first data into the first physical page, wherein the third data has written into another lower physical page among the physical pages, and the another lower physical page is adjacent to the lower physical page of the first physical page pair; and when the backup area does not store the third data, reading the third data from the another lower physical page and temporarily storing the read third data into the backup area before writing the first data into the first physical page.

2. The data writing method as recited in claim 1 further comprising:

when the first physical page is the upper physical page of the first physical page pair, determining whether the backup area stores data belonging to at least one physical page pair among the physical page pairs before writing the first data into the first physical page, wherein the at least one physical page pair is adjacent to and arranged before the first physical page pair in the rewritable non-volatile memory module; and when the backup area does not store the data belonging to the at least one physical page pair, reading the data belonging to the at least one physical page pair from the at least one physical page pair and temporarily storing the data belonging to the at least one physical page pair into the backup area before writing the first data into the first physical page.

3. The data writing method as recited in claim 1, wherein each of the physical page pairs further has a middle physical page, and the data writing method further comprises:

when the first physical page is the upper physical page of the first physical page pair, determining whether the backup area stores data belonging to the middle physical page of the first physical page pair before writing the first data into the first physical page; and when the backup area does not store the data belonging to the middle physical page of the first physical page pair, reading the data belonging to the middle physical page of the first physical page pair from the middle physical page of the first physical page pair and temporarily storing the data belonging to the middle physical page of the first physical page pair into the backup area before writing the first data into the first physical page.

4. The data writing method as recited in claim 1, wherein the backup area is a buffer memory.

5. The data writing method as recited in claim 1 further comprising:

configuring at least one of the physical blocks as the backup area.

6. The data writing method as recited in claim 1 further comprising:

determining whether a program failure occurs in the first physical page after writing the first data into the first physical page; and when the program failure occurs in the first physical page, writing the first data and the second data into a second physical page pair among the physical page pairs.

7. A memory controller for operating a rewritable non-volatile memory module, wherein the rewritable non-volatile memory module has a plurality of physical blocks, each of the physical blocks has a plurality of physical pages, the physical pages are grouped into a plurality of physical page pairs, each of the physical page pairs at least has a lower physical page and an upper physical page, a speed of writing data into the lower physical page is faster than a speed of writing the data into the upper physical page, and the memory controller comprises:

a host interface, configured to couple to a host system;

a memory interface, configured to couple to the rewritable non-volatile memory module; and a memory management circuit, coupled to the host interface and the memory interface, wherein the memory management circuit is configured to receive a write command and first data corresponding to the write command and write the first data into a first physical page among the physical pages, and the first physical page belongs to a first physical page pair among the physical page pairs, wherein the memory management circuit is further configured to determine whether the first physical page is the upper physical page of the first physical page pair before writing the first data into the first physical page, wherein when the first physical page is the upper physical page of the first physical page pair, the memory management circuit is further configured to determine whether a backup area stores second data before writing the first data into the first physical page, wherein the second data has written into the lower physical page of the first physical page pair, wherein when the backup area does not store the second data, the memory management circuit is further configured to read the second data from the lower physical page of the first physical page pair and temporarily store the second data into the backup area before writing the first data into the first physical page, wherein when the first physical page is the upper physical page of the first physical page pair, the memory management circuit is further configured to determine whether the backup area stores third data before writing the first data into the first physical page, the third data has written into another lower physical page among the physical pages, and the another lower physical page is adjacent to the lower physical page of the first physical page pair, wherein when the backup area does not store the third data, the memory management circuit is further configured to read the third data from the another lower physical page and temporarily store the read third data into the backup area before writing the first data into the first physical page.

8. The memory controller as recited in claim 7, wherein when the first physical page is the upper physical page of the first physical page pair, the memory management circuit is further configured to determine whether the backup area stores data belonging to at least one physical page pair among the physical page pairs before writing the first data into the first physical page, and the at least one physical page pair is adjacent to and arranged before the first physical page pair in the rewritable non-volatile memory module, wherein when the backup area does not store the data belonging to the at least one physical page pair, the memory management circuit is further configured to read the data belonging to the at least one physical page pair from the at least one physical page pair and temporarily store the data belonging to the at least one physical page pair into the backup area before writing the first data into the first physical page.

9. The memory controller as recited in claim 7, wherein each of the physical page pairs further has a middle physical page, when the first physical page is the upper physical page of the first physical page pair, the memory management circuit is further configured to determine whether the backup area stores data belonging to the middle physical page of the first physical page pair before writing the first data into the first physical page, wherein when the backup area does not store the data belonging to the middle physical page of the first physical page pair, the memory management circuit is further configured to read the data belonging to the middle physical page of the first physical page pair from the middle physical page of the first physical page pair and temporarily store the data belonging to the middle physical page of the first physical page pair into the backup area before writing the first data into the first physical page.

10. The memory controller as recited in claim 7, further comprising a buffer memory, wherein the backup area is the buffer memory.

11. The memory controller as recited in claim 7, wherein the memory management circuit further configures at least one of the physical blocks as the backup area.

12. The memory controller as recited in claim 7, wherein the memory management circuit is further configured to determine whether a program failure occurs in the first physical page after writing the first data into the first physical page, wherein when the program failure occurs in the first physical page, the memory management circuit is further configured to write the first data and the second data into a second physical page pair among the physical page pairs.

13. A memory storage apparatus comprising:

a rewritable non-volatile memory module having a plurality of physical blocks, wherein each of the physical blocks has a plurality of physical pages, the physical pages are grouped into a plurality of physical page pairs, each of the physical page pairs at least includes a lower physical page and an upper physical page, and a speed of writing data into the lower physical page is faster than a speed of writing the data into the upper physical page;

a connector, configured to couple to a host system; and a memory controller, coupled to the rewritable non-volatile memory module and the connector, wherein the memory controller is configured to receive a write command and first data corresponding to the write command and write the first data into a first physical page among the physical pages, and wherein the first physical page belongs to a first physical page pair among the physical page pairs, wherein the memory controller is further configured to determine whether the first physical page is the upper physical page of the first physical page pair before writing the first data into the first physical page, wherein when the first physical page is the upper physical page of the first physical page pair, the memory controller is further configured to determine whether a backup area stores second data before writing the first data into the first physical page, wherein the second data has written into the lower physical page of the first physical page pair, wherein when the backup area does not store the second data, the memory controller is further configured to read the second data from the lower physical page of the first physical page pair and temporarily store the second data into the backup area before writing the first data into the first physical page, wherein when the first physical page is the upper physical page of the first physical page pair, the memory controller is further configured to determine whether the backup area stores third data before writing the first data into the first physical page, wherein the third data has written into another lower physical page among the physical pages, and the another lower physical page is adjacent to the lower physical page of the first physical page pair, wherein when the backup area does not store the third data, the memory controller is further configured to read the third data from the another lower physical page and temporarily store the read third data into the backup area before writing the first data into the first physical page.

14. The memory storage apparatus as recited in claim 13, wherein when the first physical page is the upper physical page of the first physical page pair, the memory controller is further configured to determine whether the backup area stores data belonging to at least one physical page pair among the physical page pairs before writing the first data into the first physical page, and the at least one physical page pair is adjacent to and arranged before the first physical page pair in the rewritable non-volatile memory module, wherein when the backup area does not store the data belonging to the at least one physical page pair, the memory management circuit is further configured to read the data belonging to the at least one physical page pair from the at least one physical page pair and temporarily store the data belonging to the at least one physical page pair into the backup area before writing the first data into the first physical page.

15. The memory storage apparatus as recited in claim 13, wherein each of the physical page pairs further has a middle physical page, when the first physical page is the upper physical page of the first physical page pair, the memory controller is further configured to determine whether the backup area stores data belonging to the middle physical page of the first physical page pair before writing the first data into the first physical page, wherein when the backup area does not store the data belonging to the middle physical page of the first physical page pair, the memory controller is further configured to read the data belonging to the middle physical page of the first physical page pair from the middle physical page of the first physical page pair and temporarily store the data belonging to the middle physical page of the first physical page pair into the backup area before writing the first data into the first physical page.

16. The memory storage apparatus as recited in claim 13, further comprising a buffer memory, wherein the backup area is the buffer memory.

17. The memory storage apparatus as recited in claim 13, wherein the memory controller further configures at least one of the physical blocks as the backup area.

18. The memory storage apparatus as recited in claim 13,
wherein the memory controller is further configured to determine whether a program failure occurs in the first physical page after writing the first data into the first physical page,
wherein when the program failure occurs in the first physical page, the memory controller is further configured to write the first data and the second data into a second physical page pair among the physical page pairs.

* * * * *